United States Patent
Alappat et al.

(10) Patent No.: US 7,152,418 B2
(45) Date of Patent: Dec. 26, 2006

(54) METHOD AND APPARATUS TO MANAGE AIRFLOW IN A CHASSIS

(75) Inventors: Kuriappan P. Alappat, Portland, OR (US); Brian S. Jarrett, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 218 days.

(21) Appl. No.: 10/885,181

(22) Filed: Jul. 6, 2004

(65) Prior Publication Data
US 2006/0005555 A1    Jan. 12, 2006

(51) Int. Cl.
*F25D 17/04* (2006.01)
*F25D 23/12* (2006.01)
*F24F 7/00* (2006.01)
*H05K 7/20* (2006.01)

(52) U.S. Cl. ............... 62/186; 62/259.2; 236/49.3; 361/690; 361/695

(58) Field of Classification Search ............ 62/186, 62/259.2; 236/49.3; 361/690, 692, 694, 361/695
See application file for complete search history.

(56) References Cited

U.S. PATENT DOCUMENTS

| | | | |
|---|---|---|---|
| 6,280,317 B1 * | 8/2001 | Przilas et al. ............... 454/184 |
| 6,285,548 B1 * | 9/2001 | Hamlet et al. ............... 361/695 |
| 6,698,079 B1 * | 3/2004 | Mimlitch et al. ............. 29/462 |
| 6,781,831 B1 * | 8/2004 | Banton et al. ............... 361/690 |
| 6,879,486 B1 * | 4/2005 | Banton et al. ............... 361/690 |
| 6,914,780 B1 * | 7/2005 | Shanker et al. ............. 361/687 |
| 6,987,673 B1 * | 1/2006 | French et al. ............... 361/727 |
| 2004/0252456 A1 * | 12/2004 | Larson et al. ............... 361/694 |

OTHER PUBLICATIONS

"Intel® NetStructure™ MPCHC0001 14U Shelf", *Technical Product Specification*, (Sep. 2003), 119 pgs.

* cited by examiner

*Primary Examiner*—Marc Norman
(74) *Attorney, Agent, or Firm*—Daly, Crowley, Mofford & Durkee, LLP

(57) ABSTRACT

A method and apparatus to manage airflow in a chassis includes one or more airflow restrictor assemblies disposed adjacent a slot within the chassis. The airflow restrictor assemblies can be set in a plurality of positions between a minimum airflow position and a maximum airflow position. The position of the airflow restrictor assembly can be set in accordance with characteristics of the module inserted in the slot. The module characteristics may include power dissipation and airflow resistance.

23 Claims, 14 Drawing Sheets

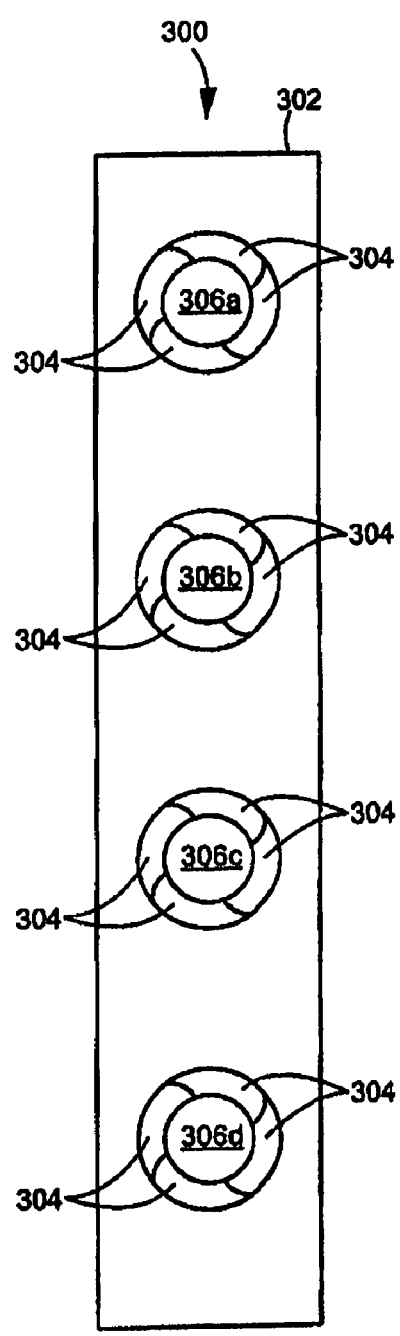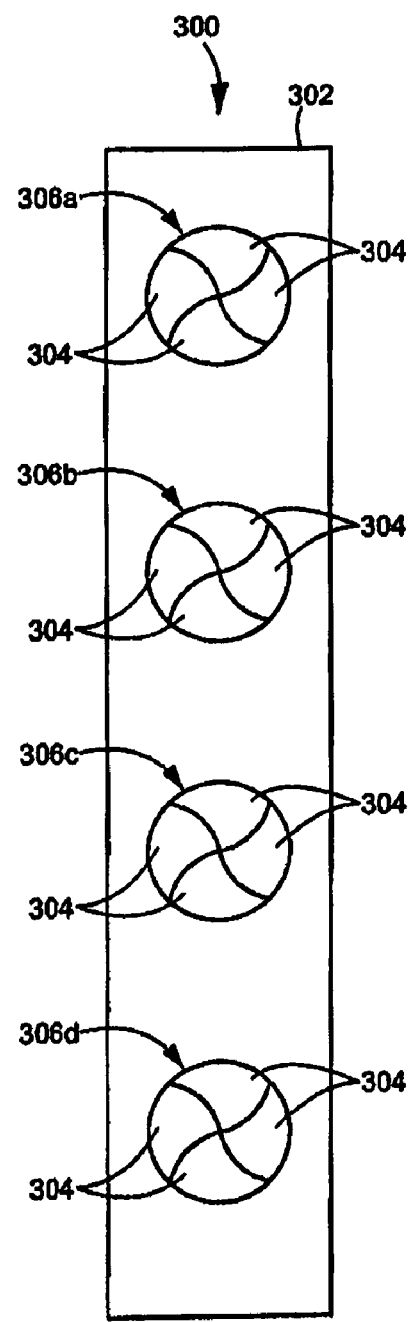
*FIG. 5A*  *FIG. 5B*

METHOD AND APPARATUS TO MANAGE AIRFLOW IN A CHASSIS

CROSS REFERENCE TO RELATED APPLICATIONS

Not Applicable

STATEMENT REGARDING FEDERALLY SPONSORED RESEARCH

Not Applicable

BACKGROUND

To remove heat from chassis and the modules of processing systems, many systems provide a flow of air through the chassis and modules (e.g. by using a fan to push or pull air past the modules). In addition to thermal characteristics associated with each chassis and module, each chassis and module also has certain airflow characteristics such as airflow resistance and the like. A module may, for example have one or both of a high airflow resistance characteristic and a high power dissipation characteristic. The high airflow resistance may be caused by devices on the module such as disk drives, heatsinks and the like which interfere with airflow through the module. Thus, to maintain acceptable temperatures within a chassis and within modules, airflow management within a chassis containing one or more modules becomes an important issue.

BRIEF DESCRIPTION OF THE DRAWINGS

The foregoing features of the method and apparatus to manage airflow in a chassis may be more fully understood from the following description of the drawings in which:

FIG. 5A is a top view of a third embodiment of an airflow restrictor in a first position;

FIG. 5B is a top view of the third embodiment of the airflow restrictor in a second position;

DETAILED DESCRIPTION

Figure 1:
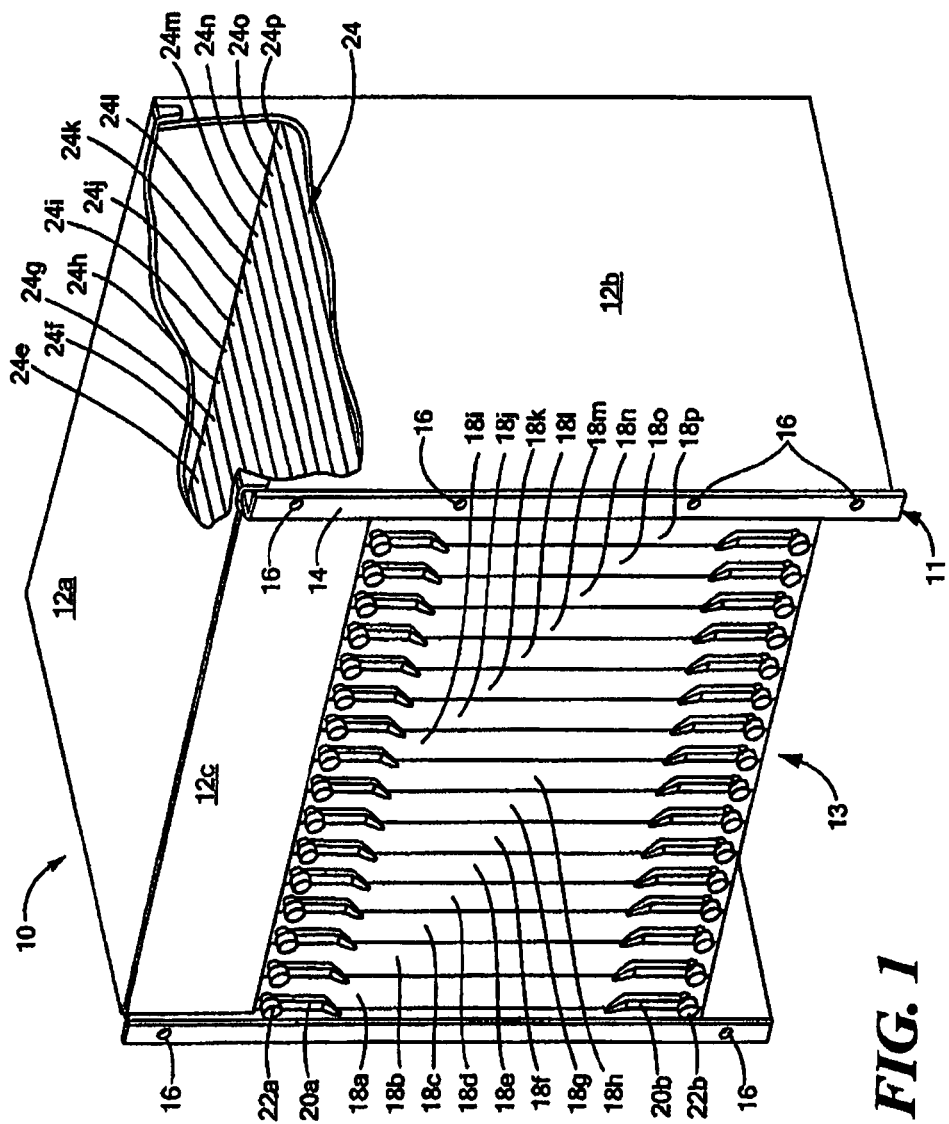
FIG. 1 is an isometric view of a chassis having a portion thereof removed to reveal an air flow restrictors.

Referring now to FIG. 1, a processing system 10 includes a chassis 11 having a top portion 12a, side portions 12b (only one side 12b being visible in FIG. 1), a front surface 12c and a plenum 13 through which air can enter the chassis 11. The chassis 11 further includes mounting brackets 14 having mounting holes 16 provided therein. The mounting brackets 14 are provided so that the processing system 10 can be mounted in a system rack (not shown) which may also hold other processing systems.

The chassis 11 has disposed therein a plurality of modules 18a–18p, generally denoted 18. As will become apparent from the description hereinbelow, the modules 18 are held in the chassis 11 via a card-cage (not visible in FIG. 1). Taking module 18a as representative of modules 18b–18p, module 18a includes an upper handle or ejector 20a, an upper fastener 22a, a lower handle 20b and a lower fastener 22b. The upper and lower handles 20a, 20b facilitate insertion and removal of the module 18a by providing a place to grip the module 18a and the fasteners 22a, 22b are used to secure the module 18a in the chassis. The fasteners may be provided, for example, as thumb screws, or any other means for securing the securing the module 18 in the chassis 11.

Portions of the top and side chassis sections 12a, 12b have been removed in FIG. 1 to reveal an airflow restrictor assembly 24. In the embodiment shown in FIG. 1, the air flow restrictor assembly 24 is provided from a plurality of individual restrictor plates 24a–24p with only restrictor plates 24e–24p visible in FIG. 1. Thus, one restrictor plate 24a–24p is disposed above a corresponding one of each of the modules 18a–18p.

The airflow restrictor assembly may be implemented with a variety of different structures. Details of several different exemplary structures for implementing airflow restrictor assemblies will be described below in conjunction with FIGS. 2–6. Suffice it here to say, however, that the airflow restrictor assembly 24 provides adjustable air flow passages within the chassis 11 to manage airflow in the chassis 11 to aid in cooling of the modules 18a–18p within the chassis 11. That is, the airflow restrictor assembly 24 provides openings of adjustable sizes with the sizes being selectable depending upon a variety of factors including but not limited to the application, the thermal and airflow characteristics of the modules within the chassis 11 and the amount of cooling desired or required to cool the module or processing system disposed in the chassis.

As mentioned above, in the embodiment of FIG. 1, the airflow restrictor assembly 24 is implemented as a plurality of restrictor plates 24a–24p which are shown in a substantially closed position in FIG. 1. In the closed position, the restrictor plates 24a–24p allow a relatively small amount of air to flow past the modules 18a–18p. As will become evident from the description provided herein below in conjunction with FIGS. 3A–3C, however, by placing the restrictor plates in a substantially fully open position, a relatively large amount of air can be directed past the modules 18 and through the opening provided by the restrictor plates. Thus, by controlling the size of openings provided by each of the restrictor plates 24a–24p, the amount of air flowing past a module and through the restrictor plate opening can be controlled.

It should be appreciated that a system such as that shown in FIG. 1 generally utilizes one of two types of cooling systems. The first type of system is a so-called "negative pressure" cooling system and the second type of system is a so-called "positive pressure" cooling system. The use of a negative pressure cooling system or a positive pressure cooling system is dependent upon the requirements of the particular application and those of ordinary skill in the art will understand how to select either a negative or a positive pressure cooling system in any particular application. It should be appreciated however that restrictor plate assemblies of the types described herein can be used with a negative pressure cooling system, a positive pressure cooling system or any other type of cooling system In a typical negative pressure cooling system, air pressure inside the chassis is lower than the air pressure outside the chassis and fans can be located at the rear (or top) of the chassis (other fan locations are, of course, also possible). The fans operate to draw air into the chassis through the front (or bottom) of the chassis (e.g., through plenum 13) and move the air from the front to the back of the chassis (or from the bottom to the top of the chassis), around modules installed in the card cage. The air moving past the modules helps regulate the temperature of the modules inside the chassis by circulating air through the chassis.

In a typical positive pressure cooling system, the air pressure inside the chassis is higher than the air pressure outside the chassis and fans can be located at the front portion of the chassis to blow or push the air into the chassis (e.g. from the bottom to the top of the chassis), around modules installed in the card cage from the front to the back of the chassis. Again, the air moving past the modules inside the chassis helps regulate the temperature of the modules inside the chassis.

In a negative air pressure system, when a module is either removed from a slot within the card cage or not installed in a slot, an opening is left where the module would otherwise be installed. This allows ambient air to enter the chassis through the opening. Thus, the negative air pressure inside the chassis is nullified by the ambient air entering through the empty slot. This in turn reduces airflow through, and hence cooling of, the remaining modules within the chassis. Modules could overheat and service could be negatively impacted.

In one prior art negative pressure cooling system, when a slot is empty, an airflow management module is inserted into the slot to impede the airflow through the empty slot and thus preserve the negative pressure within the chassis. However, this is a manual process and if a technician fails to install an airflow management module promptly or forgets to install the airflow management module at all, the operation of the remaining modules in the chassis could be affected.

Figure 2:
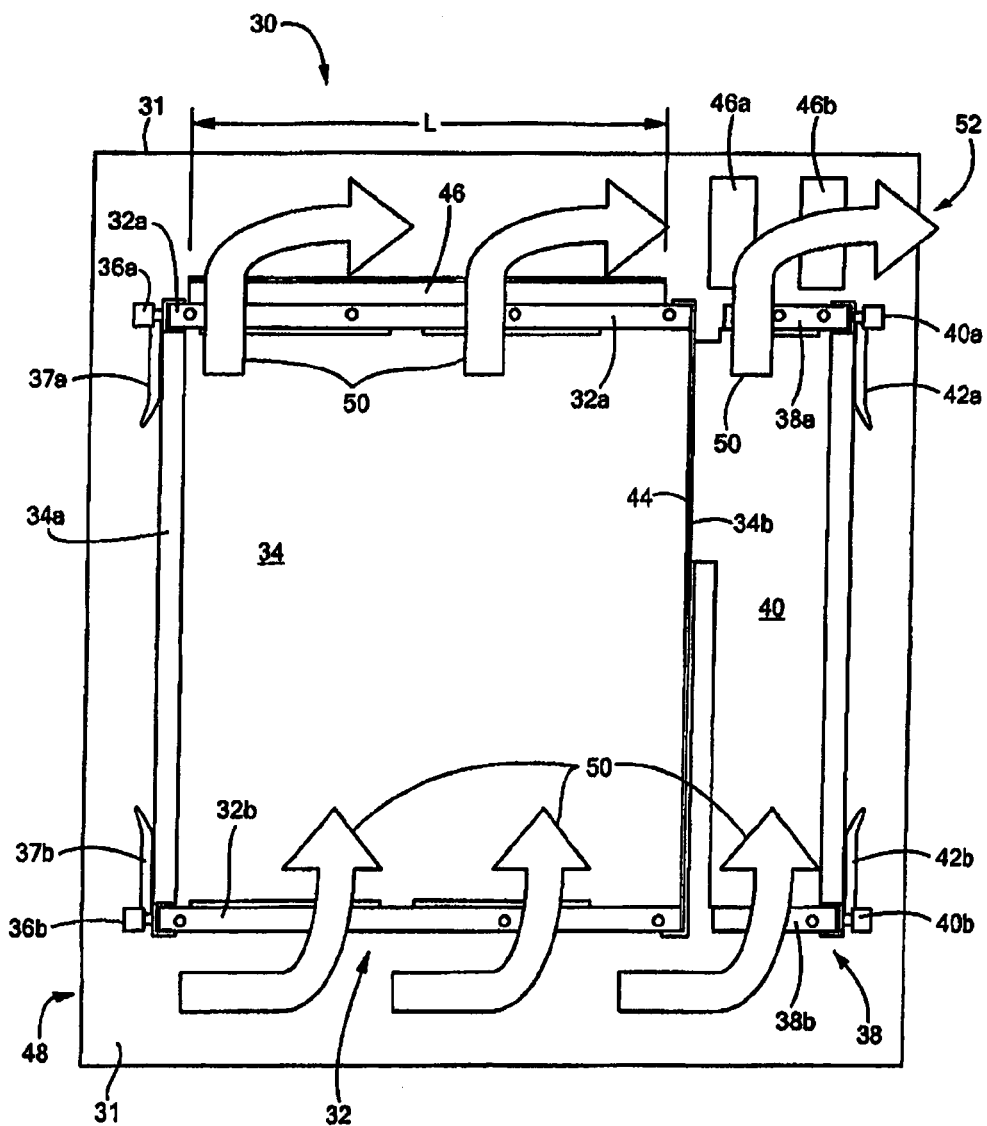
FIG. 2 is a side view of a chassis having two modules and an airflow restrictor plate.

Referring now to FIG. 2, a processing system 30 includes a chassis 31 and a first card cage 32 provided from first upper and lower support structures 32a, 32b. A first module 34 is disposed in the first card cage 32 and is secured by fasteners 36a, 36b. The module 34 also has upper and lower handles 37a, 37b coupled thereto. The handles 37a, 37b may be similar to the handles described above in conjunction with FIG. 1.

The chassis also includes a second card cage 38 provided from second upper and lower support structures 38a, 38b. A second module 40 is disposed in the second card cage and is secured by fasteners 40a, 40b and handles 42a, 42b are coupled to the module. The first and second modules 34, 40 are electrically coupled at a connection point 44.

A first airflow restrictor assembly 46 is disposed proximate the first module 34. In this particular embodiment, the airflow restrictor assembly is provided as a restrictor plate which extends a length L which is substantially equal to the length of the module 34. In other embodiments, however, it may be desirable to provide a restrictor plate having a length which is longer than or shorter than the length of the module depending upon thermal and other requirements of the module, chassis and processing system. For example, in some embodiments, it may be desirable to provide the restrictor plate having a length such that it extends substantially the length of both the first and second modules 34, 40. In still other embodiments, it may be desirable to utilize the first restrictor plate for only the first module 34 and to associate a second different airflow restrictor assembly (which may or may not be implemented as restrictor plates) with the second module. In this case, the second airflow restrictor assembly may be implemented in a manner which is different than the first airflow restrictor assembly.

The system also includes one or more fans 47a, 47b which promote the flow of air though the chassis 31. In this particular embodiment, the fans are located within an upper rear portion of the chassis 31 to create a low pressure environment within the chassis 31 resulting in air being drawn in through a plenum 48 located on a bottom, front side of the chassis 31. As indicated by reference numerals 50, air enters the card cage 32 through the plenum 48 and moves through the card cage 32 past the modules 34, 40, through the restrictor plate 46 and toward the fans 46a, 46b. The air flow 50 cools the modules 34, 40 inserted into the slots of the card cage 32. The air exits the rear of the chassis through a top plenum 52 located at the top, rear of the chassis 31.

By controlling the size of an opening provided by the restrictor plate 46, the amount of air 50 flowing past the module 34 and through the opening provided by the restrictor plate 46 can be controlled. For example, by placing the restrictor plate 46 in a first position corresponding to a fully open position, a relatively large amount of air 50 is directed past the module 34 and through the opening provided by the restrictor plate 46. By placing the restrictor plate 46 in a second position corresponding to a fully closed position, a relatively small amount of air 50 is directed past the modules 34 since the closed restrictor plate 46 does not allow air (except for leakage) to flow therethrough.

Figure 3A:
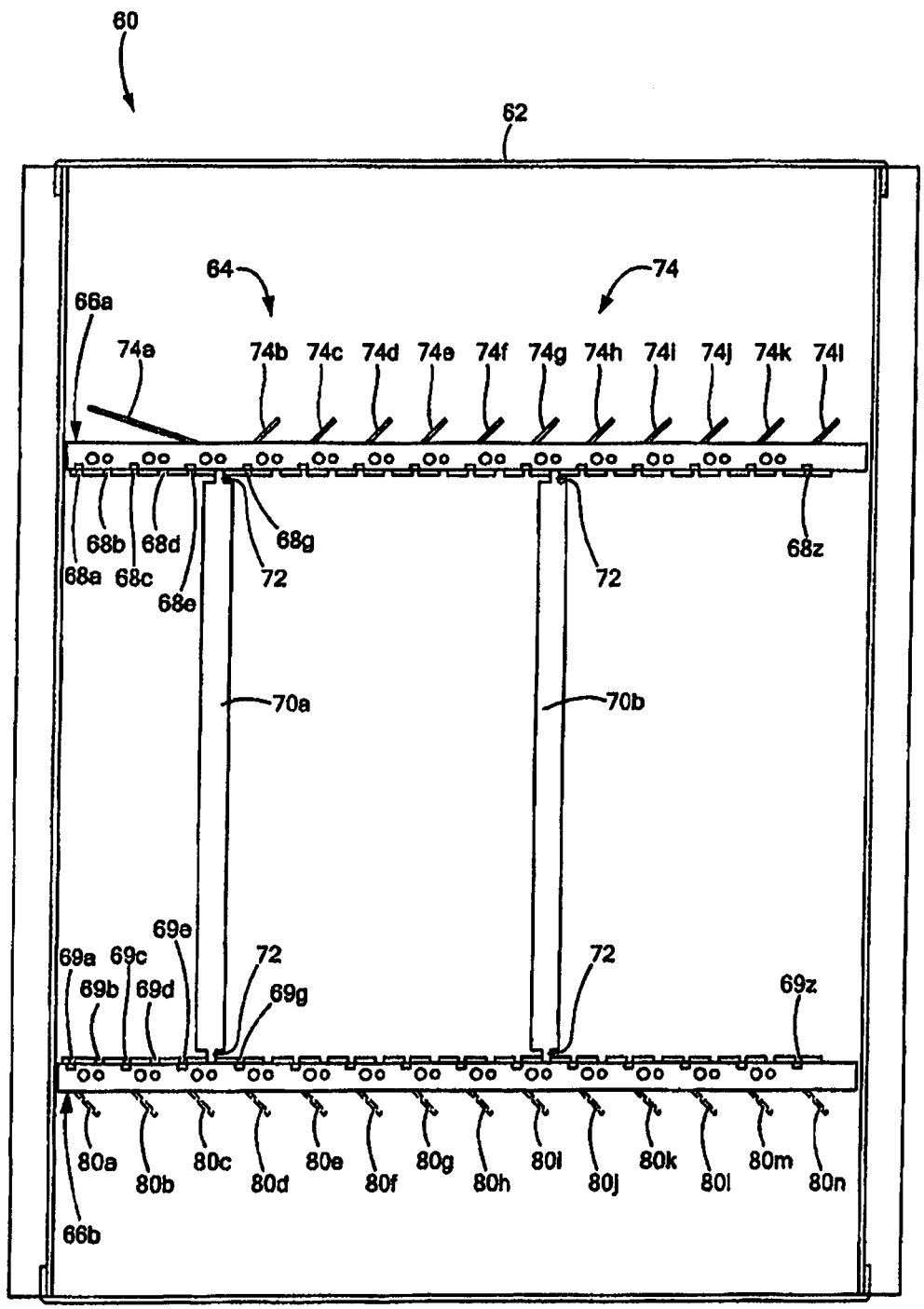
FIG. 3A is a front view of a chassis which includes an airflow restrictor in a partially open position.
Figure 3B:
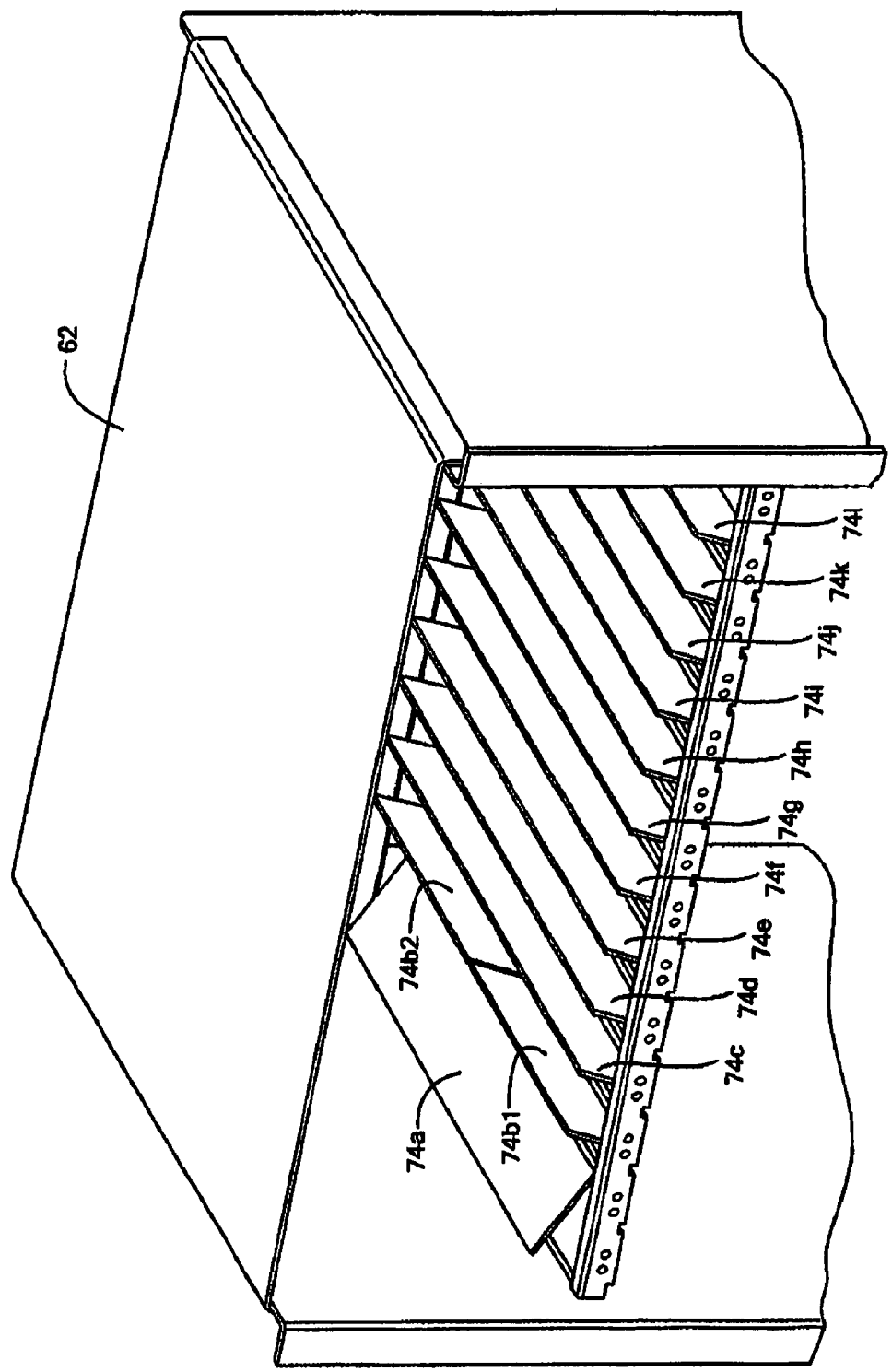
FIG. 3B is an isometric view of a portion of the chassis of FIG. 1B having an airflow restrictor in an open position.
Figure 3C:
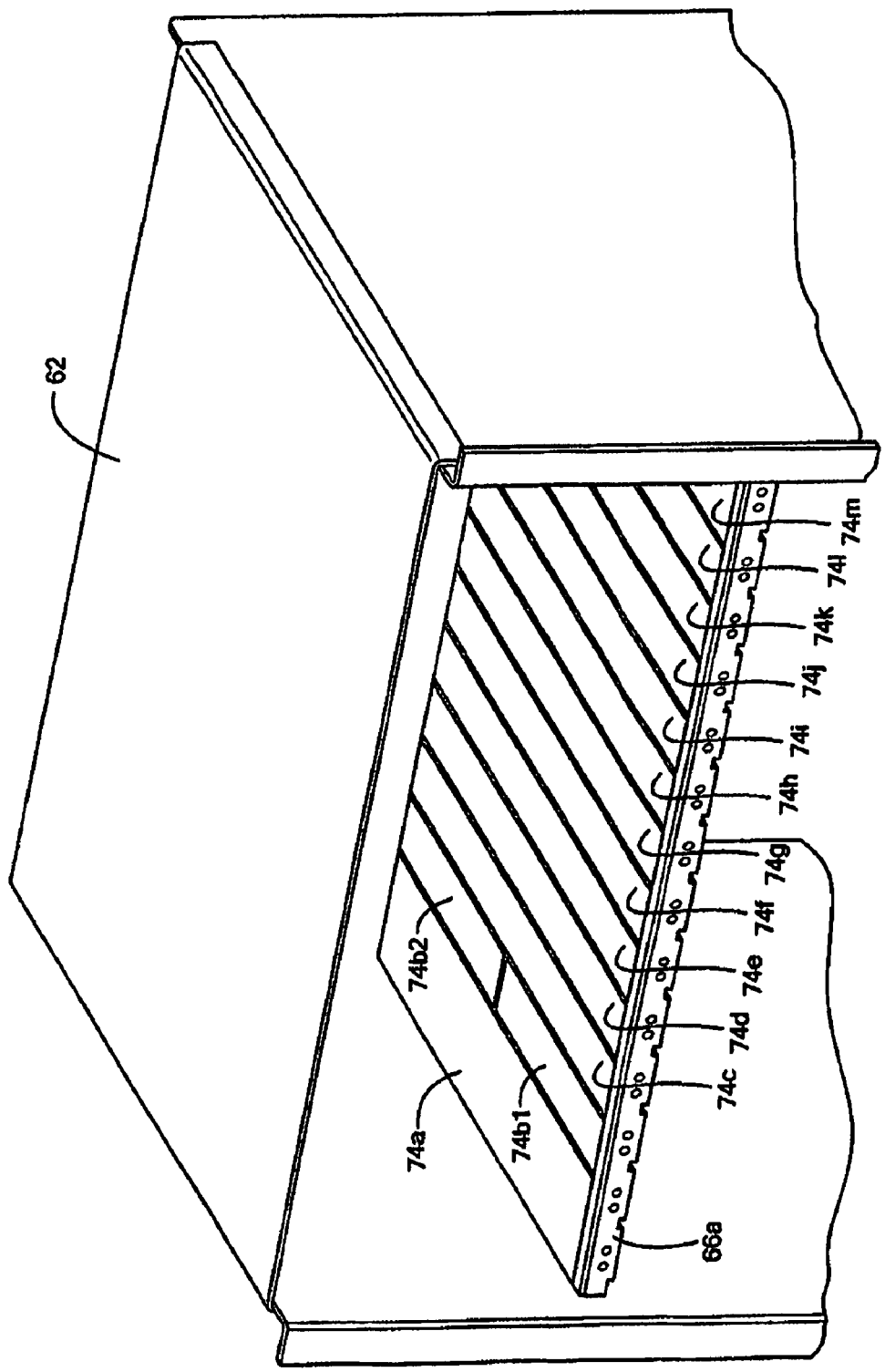
FIG. 3C is an isometric view of the chassis of FIG. 1B having the airflow restrictor in a closed position.

Referring now to FIGS. 3A–3C in which like elements are provided having like reference designations, a processing system 60 includes a chassis 62 which includes a card cage 64 provided from upper and lower support structures 66a, 66b. Each of the support structures 66a, 66b have slots 68a, 68b and 69a–69e respectively provided therein. Thus each of the upper and lower slots can form slot pairs (e.g., slots 68a and 69a can form a slot pair).

Each of the upper-lower slot pairs are adapted to accept a card 70 and in particular edges 72 of the card 70. In FIG. 3A, only two cards 70a, 70b are shown disposed in the card cage 64. Those of ordinary skill in the art will appreciate of course that fewer or more than two cards 70 can be disposed in the card cage 64 depending upon the particular application. In some applications, a card 70 may be disposed in every slot and in other applications a card may be disposed in less than every slot.

Disposed proximate the upper support structure 66a, is an airflow restrictor assembly 74. In this particular embodiment, the airflow restrictor assembly 74 is comprised of a plurality of individual plates or doors 74a–74l. In a preferred embodiment, each of the plates 74a–74l move independently of each other. That is, one plate (e.g. plate 74b) can be in a different position than another one of the plates (e.g. plate 74c). In other embodiments, however, it may be desirable to provide the plates 74a–74l such that all of the plates 74a–74l move together in unison.

The particular position of each individual plate 74a–74l can be selected so that a particular module (e.g. module 70b) receives a preferred (or in a best case scenario, an optimum) air flow. One reason to maintain a preferred air flow is to maintain the temperature of the module and the circuit components therein within an acceptable temperature range. The position of each plate 74a–74l can be determined by the specific module 70 inserted in the slot (or slots) associated with that plate.

It should also be appreciated that all plates 74a–74l need not be of the same size. For example, restrictor plate 74a is provided having a different width than restrictor plate 74b. In the exemplary embodiment of FIG. 3A, restrictor plate 74a can control the amount of air flow through the first five slots (designated 68a–68e) in the card cage.

The restrictor plate 74b, on the other hand, controls the amount of air flow in a single slot 68g. In some cases, a single slot may have multiple restrictor plates disposed thereover. Thus, a single restrictor plate may be used to regulate air flow through a single slot as shown by air flow restrictor plate 74a, or a single airflow restrictor plate (e.g., restrictor plate 74a) can be used to regulate air flow through multiple slots or a single slot may have a plurality of air flow restrictor plates disposed thereabout.

It should also be appreciated that the restrictor plate 74a opens on an opposite side as plates 74b–74l. In the exemplary embodiment of FIGS. 3A–3C, each of the air flow restrictors is implemented as a door which extends the length of the slot, although other embodiments could use a door that doesn't extend the length of the slot. The door may be hinged along its side.

As mentioned above, in FIG. 3A, the airflow restrictor plates 74a–74l are shown in a partial airflow position. While all the airflow restrictor plates 74a through 74l are shown in generally the same position, it should be appreciated that each airflow restrictor plate can be positioned independently from the other airflow restrictor plates. This partial airflow arrangement may be utilized for modules that do not have high power dissipation and/or high airflow resistance, but still require a certain amount of cooling.

FIG. 3A also shows a plurality of restrictor plates 80a–80n disposed adjacent a bottom edge of the slots in card cage. The airflow restrictor plates 80a–80n may be similar to airflow restrictor plates 74a–74l and can be positioned between a maximum airflow position and a minimum airflow position. The airflow restrictor plates 80a–80n can be used in place of or in conjunction with air flow restrictor plates 74a–74l. Airflow restrictor plates 80a–80n can be positioned independently from airflow restrictor plates 74a–74l. Thus, it should be appreciated that air flow restrictor assemblies can be provided on either side of the modules with which they are associated.

In some applications, it may be desirable to provide an airflow restrictor assembly both above and below a module or card cage. The fully open or maximum airflow arrangement shown in FIG. 3B may be utilized for modules that have a high power dissipation and/or a relatively high airflow resistance characteristic. The air flow restrictor plates 74a–74l, 80a–80n may include linkage (not shown) as would be known by one of ordinary skill in the art, to control the positioning of the restrictor with respect to the slot.

Referring briefly to FIG. 3B, the restrictor plates 74 are all shown in a first or fully open position. As shown in FIG. 3B, restrictor plate 74b is comprised of two parts $74b_1$ and $74b_2$. Although both parts are shown in the same position, it should be appreciated that the parts $74b_1$ and $74b_2$ can move independently of each other. Thus, part $74b_1$ could be placed in a fully enclosed position while art $74b_2$ could be placed in a fully open position. This approach provides an extra degree of freedom in managing air flow in a slot.

It should be understood that the restrictor plates 74 can be placed in any position between the fully open and fully closed positions. The airflow restrictor plates 74 are thus movable between multiple positions in order to define airflow within the associated slot.

It should also be appreciated that some restrictor plates 74 may be placed in an open position (either a fully or partially open position) while at the same time other restrictor plates may be in a fully closed position. For example, if all of the slots of the card cage were fully populated except for one slot (referred to as the "empty slot"), it may be desirable to place the restrictor plate associated with the empty slot in the fully closed position while placing the other restrictor plates associated with the filled slots in open positions. This way, the restrictor plates can change the flow of air so that air flows over the modules rather than through the empty slot.

In one particular embodiment, the airflow restrictor assembly 74 is set to automatically provide a predetermined amount of airflow within a portion of the chassis depending upon whether a module is installed in the card cage. In systems in which air pressure inside the chassis is less than the air pressure outside the chassis (i.e. a negative pressure system), the airflow restrictor assembly is set to automatically reduce the amount of airflow through a slot upon removal of a module from the slot in the card cage. The airflow restrictor assembly can also be set to automatically provide a reduced airflow in a slot which never has a module installed therein. Since the air pressure inside the chassis is less than the air pressure outside the chassis, this reduced airflow setting prevents the negative air pressure within the chassis from being nullified by preventing a majority of the airflow from taking a path through the unoccupied slot which would in turn reduce airflow through the remaining slots.

Conversely, when a module is installed into a slot the airflow restrictor assembly automatically provides an opening thereby permitting an appropriate amount of airflow through the slot. The positioning of individual restrictor plates 74a–74l in the airflow restrictor assembly 74 may be thus accomplished automatically (either mechanically controlled, electronically controlled or controlled by a processor).

Referring now to FIG. 3C, the restrictor plates 74 are shown in a second or fully closed position. This second position results a reduced airflow through the restrictor plates may be utilized when a module is removed or not installed in a slot. In a system which utilizes negative pressure for cooling, this would preserve the negative air pressure within the system. The positioning of airflow restrictor plates 74a–74l may be done manually or automatically upon insertion of a module into a slot.

Referring now to FIGS. 4A through 4I, in which like elements are provided having like reference designations, another embodiment of an airflow restrictor assembly is implemented using two plates 102 and 104 disposed in a movable overlapping engagement. Plate 102 is provided having a plurality of holes 106 provided therein. Similarly, plate 104 is provided having a plurality of holes 108 disposed in a pattern which matches the pattern in plate 102. While the holes 104 and 108 are shown having a circular shape, it should be appreciated that any shape holes could be used including but not limited to rectangular, square, oval, pentagonal, octagonal or any irregular shapes.

In this exemplary embodiment, the holes 106 are disposed in a regular pattern in plate 102. It should be appreciated of course that the holes 106, 108 need not be provided in a regular pattern (i.e. the holes need not be regularly spaced). Further, the holes 106, 108 can be of any size and can vary in size and/or shape across the plates 102, 104. Additionally, the pattern of the holes need not be uniform. That is, there can be more holes in one part of the plate 102, 104 than in another. Furthermore the hole patterns, hole sizes and hole shapes need not be the same between the two plates 102, 104.

Plate 102 is movable with respect to plate 104. The positioning of the plate 102 with respect to plate 104 determines the amount of airflow within the associated slot. Specifically, the degree to which holes 106, 108 in the two plates 102, 104 align determines the amount of air flow allowed by the plates 102, 104.

A key 110 (most clearly seen in FIG. 4E) can be used to automatically set the relative positions of the plates 102, 104. It should be appreciated however that the relative positions of the plates 102 and 104 of the airflow restrictor may be determined with or without a key. While the use of key 110 for determining the positioning of plate 102 with respect to plate 104 is described in this embodiment it should be understood that other mechanical, electrical or manual means could also be used to provide the positioning of plate 102 with respect to plate 104.

Figure 4A:
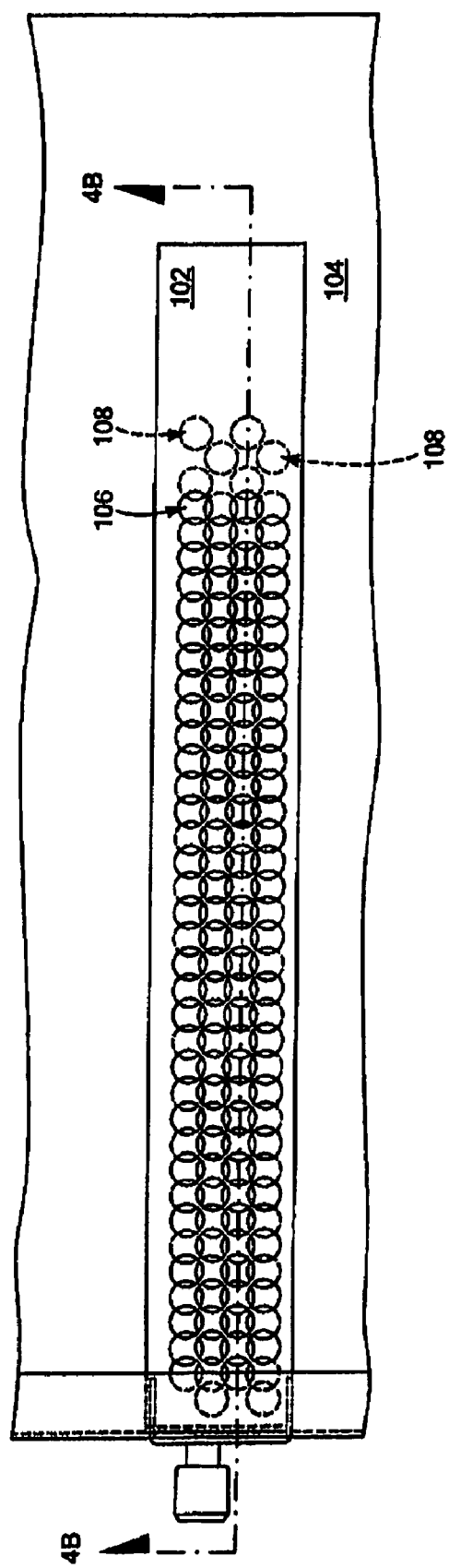
FIG. 4A is a top view of a portion of a chassis having a second embodiment of an airflow restrictor in a first position.
Figure 4C:
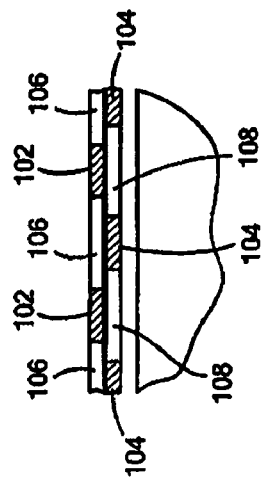
FIG. 4C is an enlarged view of a portion of FIG. 4B taken along lines 4C—4C in FIG. 4B.
Figure 4B:
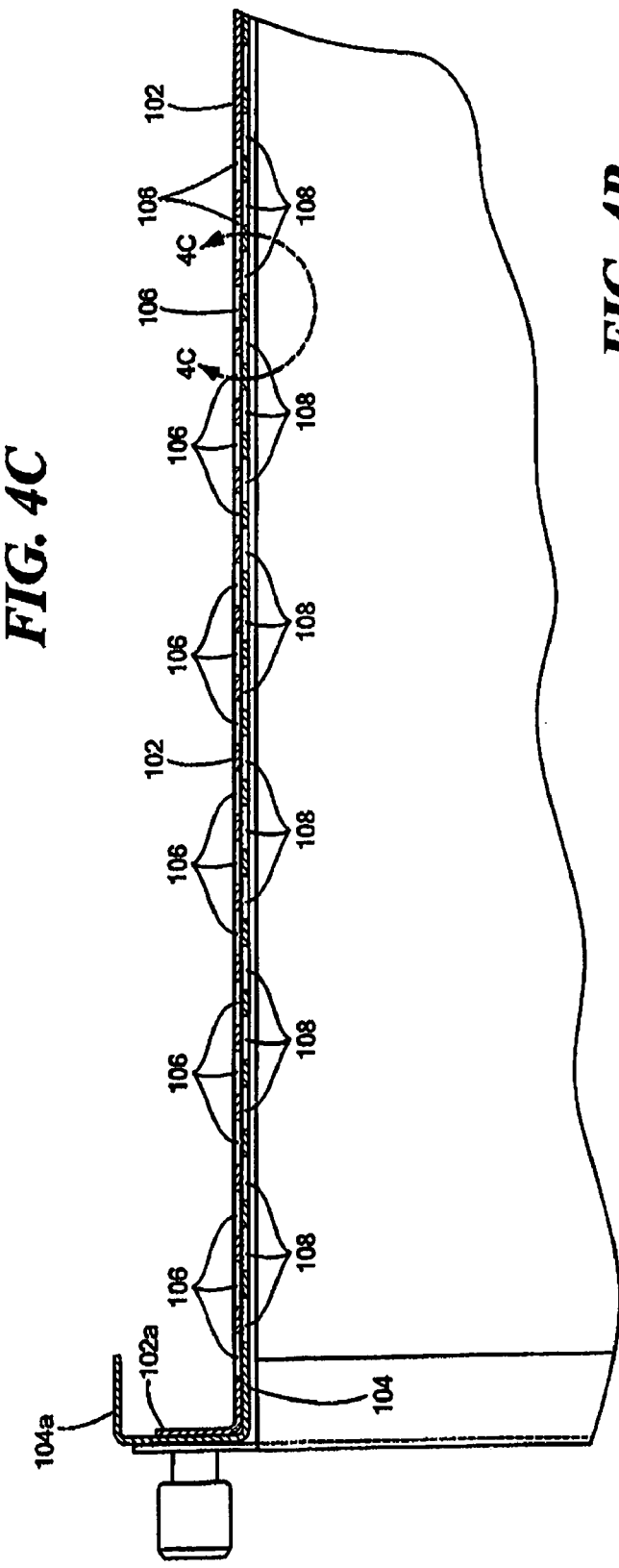
FIG. 4B is a cross-sectional view of the portion of the chassis shown in FIG. 4A taken along lines 4B—4B in FIG. 4A.

Referring now to FIGS. 4A–4C, plate 102 is positioned with respect to plate 104 such that the holes 106 of plate 102 are either not overlapping with holes 108 of plate 104 or are only slightly overlapping with holes 108 of plate 104. In such a position, only a relatively small amount of airflow, if any, is provided through the associated slot. This positioning of the plates 102 and 104 may be used when a module is removed or not installed in a slot, thereby preserving the negative air pressure within the system. In this position, it is not necessary to use a key, as the end portion of plate 102 is disposed abutting the end portion of plate 104. In some embodiments, however, a key can be used to set the position of plate 102 with respect to plate 104 to provide the minimal airflow position.

Figure 4D:
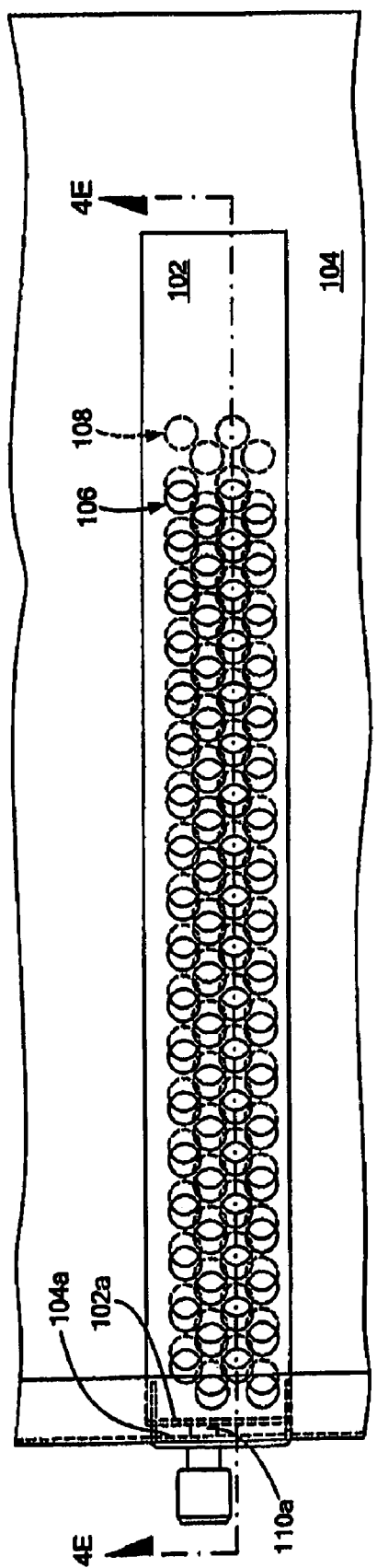
FIG. 4D is a top view of the portion of the chassis shown in FIG. 4A having the airflow restrictor in a second position.
Figure 4E:
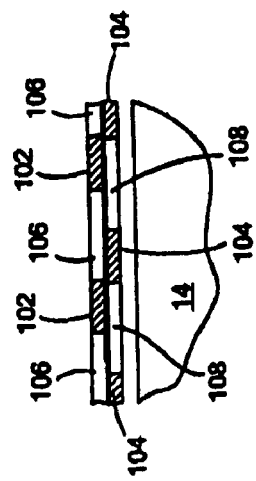
FIG. 4E is a cross-sectional view of the portion of the chassis shown in FIG. 4D taken along lines 4E—4E in FIG. 4D.
Figure 4F:
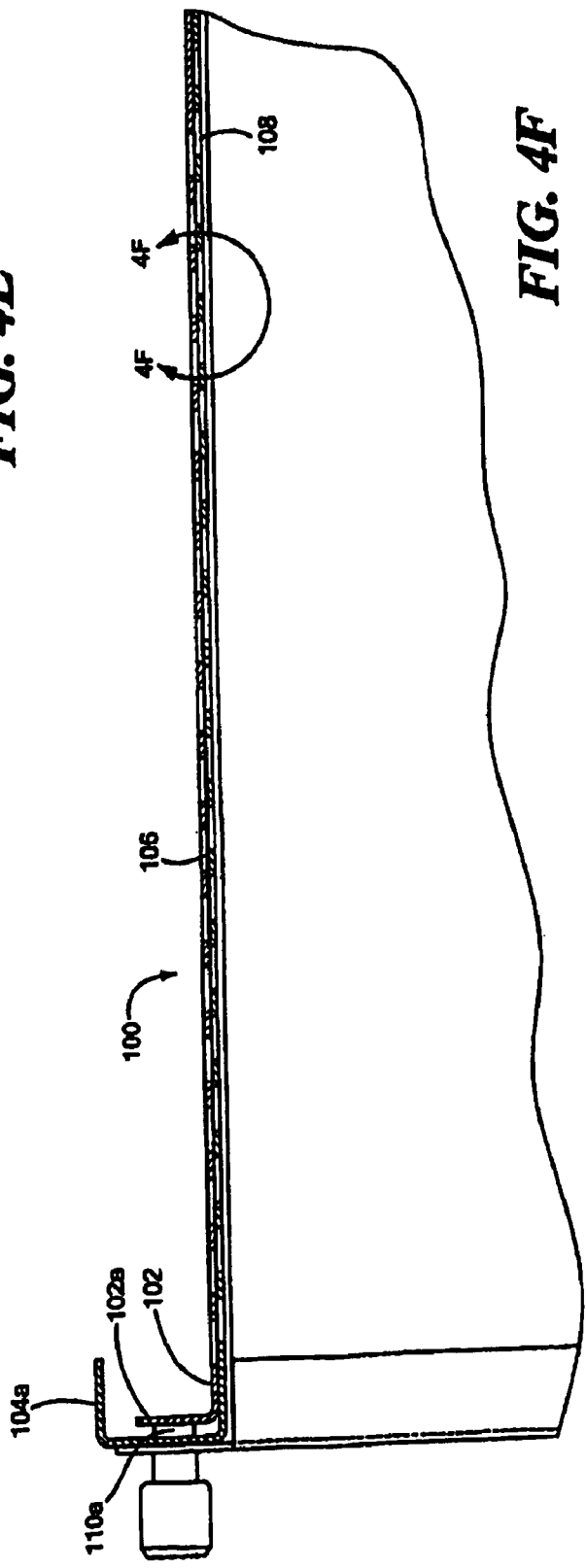
FIG. 4F is an enlarged view of a portion of FIG. 4E taken along lines 4F—4F in FIG. 4E.

Referring now to FIGS. 4D–4F a view of the airflow restrictor assembly is shown with the plates 102, 104 disposed in a partial airflow position. A key 110a is utilized to position plates 102, 104 in this partial airflow position. In this position, as determined by key 110a, plate 102 is positioned with respect to plate 104 such that the holes 106 of plate 102 are partially overlapping, but not completely aligned with, the holes 108 of plate 104. Since the holes 106, 108 are not completely aligned, only a certain amount of airflow is provided through the associated slot. The airflow provided by this arrangement is greater than the airflow provided by the arrangement shown in FIGS. 4A–4C, but not the greatest amount of airflow available. This relative position of plates 102, 104 and holes 106, 108 may be utilized for modules that do not have high power dissipation and/or high airflow resistance, but still require a certain amount of cooling. The key may be provided as part of the module being inserted into the slot of the cord coop. In this manner the module can automatically set the correct positions of the plates 102, 104 and thus automatically receive the appropriate airflow.

Figure 4G:
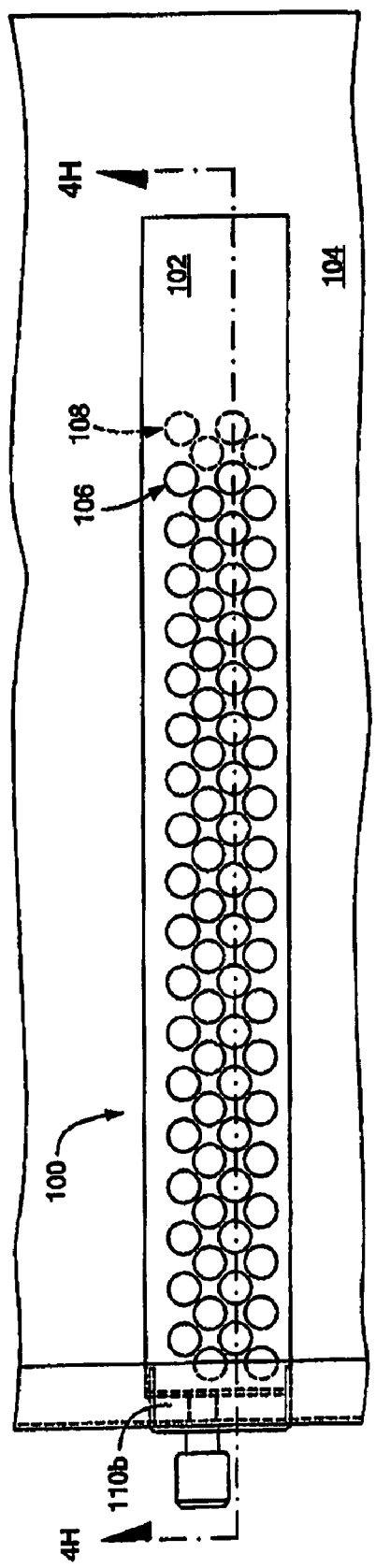
FIG. 4G is a top view of the portion of the chassis shown in FIG. 4A having the airflow restrictor in a third position.
Figure 4I:
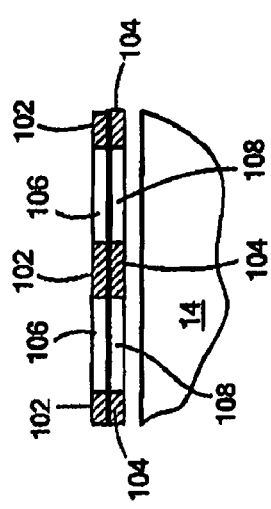
FIG. 4I is an enlarged view of a portion of FIG. 4H defined by lines 4I—4I in FIG. 4E.
Figure 4H:
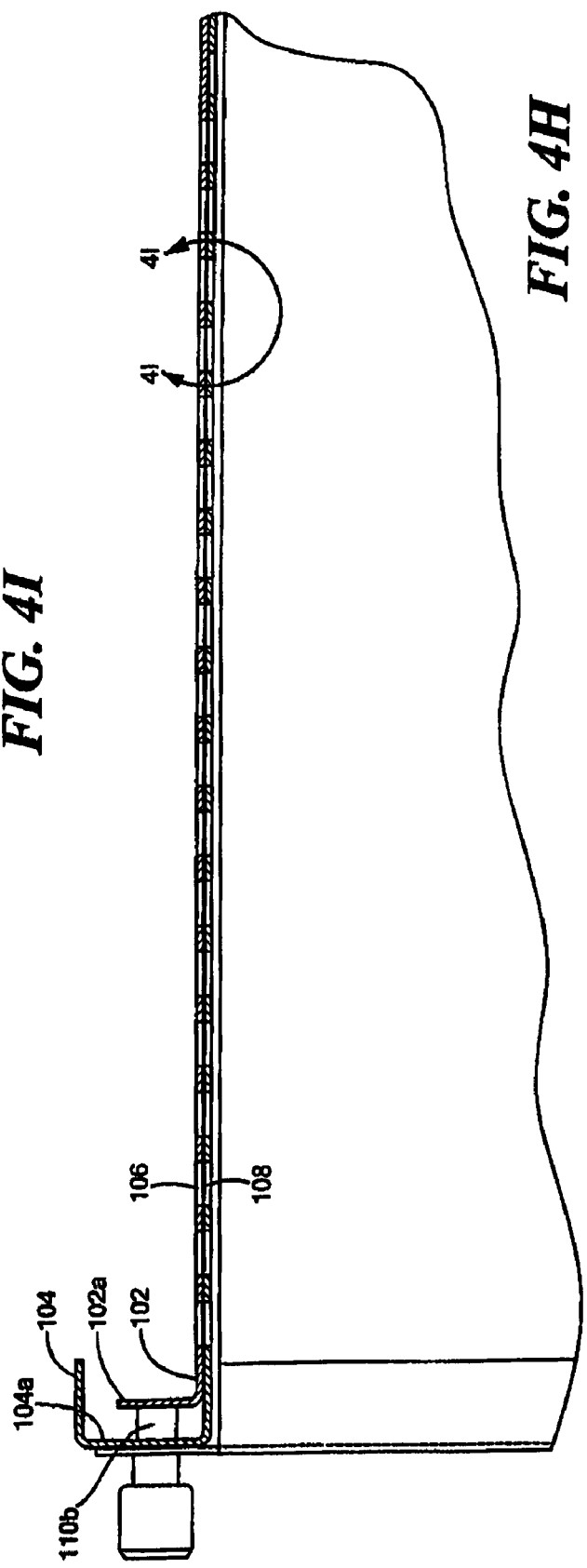
FIG. 4H is a cross-sectional view of the portion of the chassis shown in FIG. 4G taken along lines 4H—4H in FIG. 4G.

Referring now to FIGS. 4G–4I a view of the airflow restrictor in a maximum airflow position is shown. A different key 110b is utilized to place plates 102, 104 in a position which allows maximum air flow. In this position, as determined by key 110b, plate 102 is positioned with respect to plate 104 such that the holes 106 of plate 102 are generally aligned with the holes 108 of plate 104. Since the holes 106, 108 of each plate 102, 104 are generally aligned with each other, a maximum amount of airflow is provided through the associated slot. Since the holes 106, 108 are substantially aligned, the airflow provided by this arrangement is greater than the airflow provided by the arrangement shown in FIGS. 4D–4F. This maximum airflow arrangement may be utilized for modules that have high power dissipation and/or high airflow resistance.

Figure 5C:
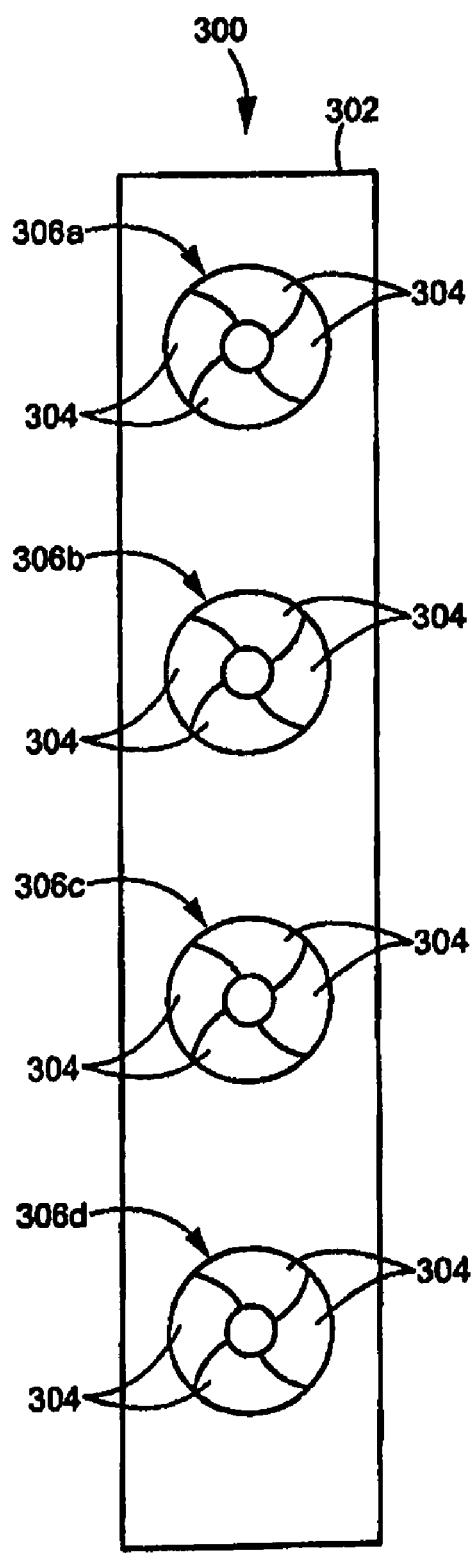
FIG. 5C is a top view of the third embodiment of the airflow restrictor in a third position.

Referring now to FIGS. 5A–5C, another embodiment of an airflow restrictor assembly 300 includes a frame 302 having one or more holes generally denoted 306. In this particular example, the airflow restrictor assembly 300 is provided having four holes 306a–306d although more or fewer than four holes can be used. Disposed about each of the holes are a series of shutter plates 304. The holes 306a–306d each can have a varying size depending upon the position of the respective shutter plates 304 which operate in a manner similar to that of a camera shutter. The shutter plates 304 are moved into the desire position by mechanical linkage (not shown) as would be known by one of ordinary skill in the art.

In a maximum airflow position, shown in FIG. 5A, the shutter plates 304 are arranged to provide the holes 306a–306d having a maximum size. This position is useful when cooling modules having high power dissipation and/or high airflow resistance.

In a minimal airflow position, shown in FIG. 5B, the shutter plates 304 are arranged to provide the holes 306a–306d having a minimum size or to provide no holes at all. This positioning of the shutter plates 304 (i.e. a closed position) may be used when a module is removed or not installed in a slot, thereby preserving the negative air pressure within the system.

Referring now to FIG. 5C, the shutter plates 304 are arranged to provide the holes 306a–306d having a size which is between the minimum hole size and the maximum hole size. This position is useful when cooling modules which don't have high power dissipation and/or high airflow restriction, yet still require some degree of cooling.

While the airflow restrictor assembly 300 is described above as having three positions, it should be understood that the airflow restrictor assembly can provide openings having any number of sizes between the maximum airflow position and the minimum airflow position and that the size of each opening may be selected independently.

Having now described several different structures for implementing an airflow restrictor assembly, some additional concepts will be explained in conjunction with FIG. 2.

Referring back to FIG. 2, it can be seen that the airflow through the system 30 could be non-uniform as it traverses through the card cage 32 from the bottom plenum 48 to the top plenum 52. For example, the top frontal area of the module 34 may receive less airflow than the rear area of the module 34 since the fans 46a and 46b are located proximate the rear of the slots. To account for this difference in airflow, the airflow restrictor assembly 46 may be provided with a graduated opening, such that the size of the opening closest to the front 34a of the module 34 is larger than the size of the opening closest to the rear 34b of the module 34. The use of an airflow restrictor assembly having a series of graduated openings (e.g., an opening which changes size along its length) can help balance airflow within the slot.

An airflow restrictor assembly having a graduated openings may be implemented in one of a variety of different ways. For example, if the air flow restrictor assembly is provided as a door-type restrictor, then the door opening may be provided having a generally triangular shape (rather than the rectangular shape of FIG. 3B for example). Alternatively, in a hole-type restrictor or a shutter-type restrictor, as shown in FIGS. 4A–5C, the holes may be provided having increasingly larger diameters along the length of the airflow restrictor assembly. Or, the pattern of holes of the airflow restrictor could include more holes toward the one end of the airflow restrictor and fewer holes toward the other end of the airflow restrictor.

Figure 6:
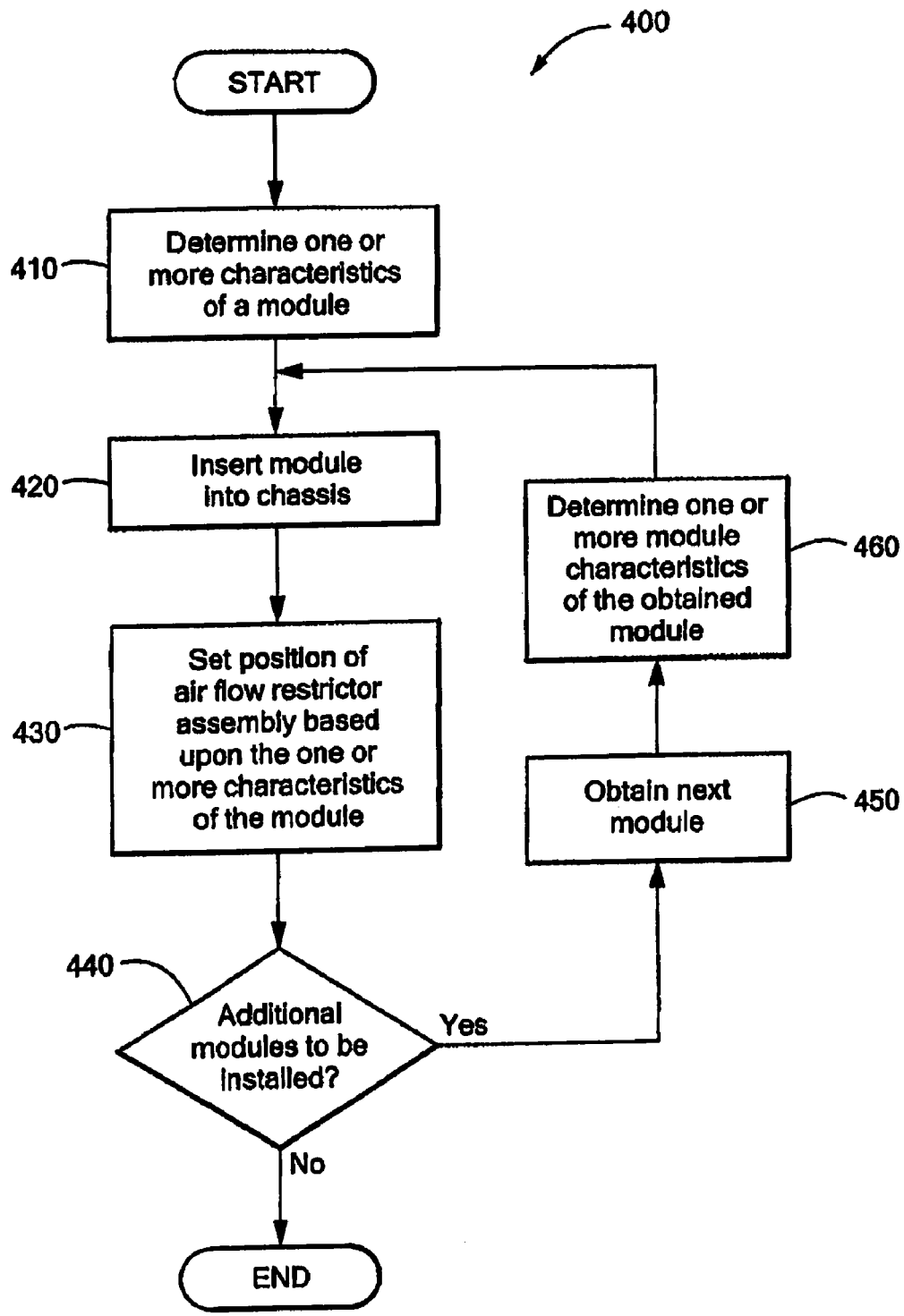
FIG. 6 is a flow diagram which illustrates a process for managing airflow within a system.

Referring now to FIG. 6, a flow diagram of a technique for providing slot-airflow management is shown. The rectangular elements are herein denoted "processing blocks" and the diamond shaped elements are herein denoted "decision blocks."

The flow diagrams do not depict the syntax of any particular programming language. Rather, the flow diagrams illustrate the functional information one of ordinary skill in the art requires to perform the techniques to manage airflow in a chassis. It will be appreciated by those of ordinary skill in the art that unless otherwise indicated herein, the particular sequence of processing blocks and decision blocks described is illustrative only and can be varied without departing from the spirit of the present method and apparatus to manage airflow in a chassis. Thus, unless otherwise stated the processing blocks and decision blocks described below are "unordered" meaning that, when possible, the processing blocks and decision blocks can be performed in any convenient or desirable order.

Processing begins in block 410 in which one or more characteristics of a module are determined. The characteristic may be airflow resistance of the module, power dissipation of the module or other relevant characteristics including but not limited to module characteristics including but not limited to power dissipation, pressure drop/flow rate, maximum inlet air temperature and maximum temperature rise; slot characteristics including but not limited to, slot impedance/airflow characteristics and temperature of a component on a module. Once the characteristics of the module/slot are determined, processing proceeds to block 420 in which a module is inserted into a slot. Note that all slots may not have the same airflow characteristics (example: outer most slots) just like all the boards will not typically have the same pressure drop/flow rate characteristics. Once the module is inserted into the slot, processing proceeds to block 430 in which the position of the relevant portion of the airflow restrictor assembly associated with the slot into which the current module has been inserted is set. The setting of the airflow restrictor assembly is done in accordance with the characteristics of the module as determined in processing block 410. For example, for a module having high airflow resistance and/or high power dissipation, the airflow restrictor assembly would typically be set at or toward a maximum airflow position. This setting of the position of the airflow restrictor assembly may be done automatically or manually.

Processing then proceeds to decision block 440 in which a determination is made regarding whether there are additional modules to be installed in the system. When there is an additional module or modules to be installed then processing block 450 is executed. When there no additional modules to be installed then the process ends.

In processing block 450 the next module is obtained and in processing block one or more characteristics for the module obtained in processing block 450 are obtained. Following processing block 460, processing blocks 410 et seq. are executed until there are no remaining modules to be installed. At this point the process ends. Since the above procedure is not precise, it may be preferable to validate the settings by conducting actual airflow and/or thermal profile tests.

The present system and related techniques for managing slot-to-slot airflow in a chassis permits high, performance cooling and hence allows high power module platforms to be used. Airflow restrictor assemblies, which may be set to a variety of positions, are disposed adjacent the slots adapted to accept modules and, depending upon a variety of factors, can be positioned such that slots not having a module receive minimal airflow, slots having a module which has high power consumption and/or high airflow resistance have maximum airflow and modules which require less airflow than modules having high power consumption and/or high airflow resistance receive an intermediate amount of airflow.

Having described preferred embodiments of a system and related techniques to manage airflow in a chassis, it will now become apparent to those of ordinary skill in the art that other embodiments incorporating these concepts may be used. Accordingly, it is submitted that that the present system and techniques to manage airflow in a chassis should not be limited to the described embodiments, but rather should be limited only by the spirit and scope of the appended claims.

What is claimed is:

1. An airflow restrictor assembly comprising:
 a hinge configured to couple to a card cage, the card cage comprising a slot configured to couple to a module; and
 a restrictor plate coupled to the hinge and movable about an axis substantially parallel to a length of the slot between a plurality of different positions with the different positions allowing an amount of airflow through the slot of the card cage.

2. The airflow restrictor assembly of claim 1, further comprising a linkage coupled to the restrictor plate to control the position of the restrictor plate.

3. The airflow restrictor assembly of claim 1 wherein the restrictor plate comprises a length which is substantially equal to a length of the slot of the card cage.

4. The airflow restrictor assembly of claim 1 wherein the restrictor plate extends a length less than the length of the slot of the card cage.

5. The airflow restrictor assembly of claim 1 wherein the restrictor plate is substantially a triangular shape.

6. The airflow restrictor assembly of claim 1 wherein the restrictor plate is substantially a rectangular shape.

7. An apparatus to manage airflow comprising:
 a card cage having a plurality of slots configured to couple to a module; and
 an airflow restrictor assembly disposed over at least one of the plurality of slots and comprising a hinge and a restrictor plate coupled to the hinge, the restrictor plate movable in a plurality of positions about an axis substantially parallel to a length of the at least one slots between a first airflow position and a second airflow position with a position of the restrictor plate assembly controlling an amount of airflow through the at least one slot of the plurality of slots.

8. The apparatus of claim 7 further comprising a lower plenum disposed beneath said slots and in fluid communication with said slots.

9. The apparatus of claim 7 further comprising an upper plenum disposed above said slots and in fluid communication with said slots.

10. The apparatus of claim 7 further comprising at least one fan in fluid communication with said slots.

11. The apparatus of claim 7 wherein the card cage has a top slot and a bottom slot and said airflow restrictor is disposed proximate a first one of the top slot and the bottom slot.

12. The apparatus of claim 7 wherein said airflow restrictor assembly is disposed over a plurality of slots in the card cage to control an amount of airflow through each of the plurality of slots.

13. The apparatus of claim 7 wherein a plurality of said airflow restrictor assemblies are disposed to control an amount of airflow through one of said plurality of said slots.

14. A method to manage airflow comprising:
determining at least one characteristic of a module to be inserted into one slot of a plurality of slots of a card cage having an air flow restrictor disposed over at least the one slot; and
setting a position of the airflow restrictor assembly, comprising a hinge and a restrictor plate coupled to the hinge, based upon the at least one characteristic of the module, setting the position comprising moving the restrictor plate to a position about an axis substantially parallel to length of the lot.

15. The method of claim 14 wherein said at least one characteristic includes at least one of:
an airflow resistance characteristic;
a power dissipation characteristic;
a heat dissipation characteristic; and
a thermal characteristic.

16. The method of claim 15 wherein setting a position of the airflow restrictor assembly comprises manually setting a position of the airflow restrictor assembly.

17. The method of claim 15 wherein setting a position of the airflow restrictor assembly comprises automatically setting a position of the airflow restrictor assembly upon insertion of said module within said slot.

18. An airflow restrictor assembly comprising:
a first hinge configured to couple to a card cage, the card cage comprising a first slot configured to couple to a first module;
a first restrictor plate coupled to the first hinge and movable about a first axis substantially parallel to a length of the first slot between a plurality of different positions with the different positions allowing an amount of airflow through the first slot;
a second hinge configured to couple to the card cage, the card cage further comprising a second slot configured to couple to a second module; and
a second restrictor plate coupled to the second hinge.

19. The airflow restrictor assembly of claim 18 wherein the second restrictor plate is movable about a second axis substantially parallel to a length of the second slot between a plurality of different positions with the different positions allowing an amount of airflow through the first slot and the second slot.

20. The airflow restrictor assembly of claim 19 wherein a closed position is one of the plurality of positions and the first restrictor plate opens from the closed position in a first rotational direction about the first axis and the second restrictor plate opens from the closed position about the second axis in an opposite rotational direction from the first rotational direction.

21. The airflow restrictor assembly of claim 18 wherein the second restrictor plate is larger than the first restrictor plate.

22. The airflow restrictor assembly of claim 21 wherein the second restrictor plate is larger than the first restrictor plate comprises a width of the second restrictor plate being longer than a width of the first restrictor plate.

23. The airflow restrictor assembly of claim 21 wherein the second restrictor plate is larger than the first restrictor plate comprises the length of the second restrictor plate being longer than the length of the first restrictor plate.

* * * * *